(12) United States Patent
Yoffe et al.

(10) Patent No.: US 8,908,723 B2
(45) Date of Patent: Dec. 9, 2014

(54) EXTERNAL CAVITY WIDELY TUNABLE LASER USING A SILICON RESONATOR AND MICROMECHANICALLY ADJUSTABLE COUPLING

(76) Inventors: Gideon Yoffe, Newark, CA (US); John Heanue, Boston, MA (US); Bardia Pezeshki, Menlo Park, CA (US)

( * ) Notice: Subject to any disclaimer, the term of this patent is extended or adjusted under 35 U.S.C. 154(b) by 0 days.

(21) Appl. No.: 13/360,627

(22) Filed: Jan. 27, 2012

(65) Prior Publication Data
US 2012/0195332 A1 Aug. 2, 2012

Related U.S. Application Data

(60) Provisional application No. 61/436,904, filed on Jan. 27, 2011.

(51) Int. Cl.
| | | |
|---|---|---|
| *H01S 3/10* | (2006.01) | |
| *H01S 5/14* | (2006.01) | |
| *H01S 5/10* | (2006.01) | |
| *H01S 5/026* | (2006.01) | |
| *H01S 5/022* | (2006.01) | |
| *H01S 5/00* | (2006.01) | |
| *H01S 5/024* | (2006.01) | |

(52) U.S. Cl.
CPC .............. *H01S 5/142* (2013.01); *H01S 5/0261* (2013.01); *H01S 5/1032* (2013.01); *H01S 5/02288* (2013.01); *H01S 5/02284* (2013.01); *H01S 5/0071* (2013.01); *H01S 5/02248* (2013.01); *H01S 5/02415* (2013.01)
USPC ................. 372/20; 372/94; 372/98; 372/101; 372/107

(58) Field of Classification Search
CPC ..... H01S 5/142; H01S 5/1032; H01S 5/0071; H01S 5/02248; H01S 5/02284; H01S 5/02415; H01S 5/0261; H01S 5/02288
USPC ............................. 372/20, 98, 94, 101, 107
See application file for complete search history.

(56) References Cited

U.S. PATENT DOCUMENTS

| | | | |
|---|---|---|---|
| 6,450,702 B1 * | 9/2002 | Komoriya et al. .............. 385/90 |
| 2005/0147134 A1 * | 7/2005 | McDonald ......................... 372/9 |
| 2006/0215713 A1 * | 9/2006 | Flanders et al. ................. 372/20 |
| 2007/0019702 A1 * | 1/2007 | Day et al. ....................... 372/101 |
| 2009/0092159 A1 * | 4/2009 | Kato ................................ 372/20 |
| 2009/0122817 A1 * | 5/2009 | Sato et al. ....................... 372/20 |
| 2009/0141747 A1 * | 6/2009 | Sato et al. ....................... 372/20 |
| 2011/0013869 A1 * | 1/2011 | Pezeshki et al. ................ 385/33 |
| 2011/0158272 A1 * | 6/2011 | Pezeshki .................... 372/38.02 |

* cited by examiner

*Primary Examiner* — Yuanda Zhang
(74) *Attorney, Agent, or Firm* — Klein, O'Neill & Singh, LLP

(57) ABSTRACT

A widely tunable laser is described where a compound semiconductor gain chip is coupled to a waveguide filter fabricated on silicon. The filter has two resonators with different free-spectral-ranges, such that Vernier tuning between the filters can be used to provide a single wavelength of light feedback into the gain chip, where the wavelength is adjustable over a wide range. The coupling between the gain chip and the filter is realized through a microlens whose position can be adjusted using micromechanics and locked in place.

5 Claims, 15 Drawing Sheets

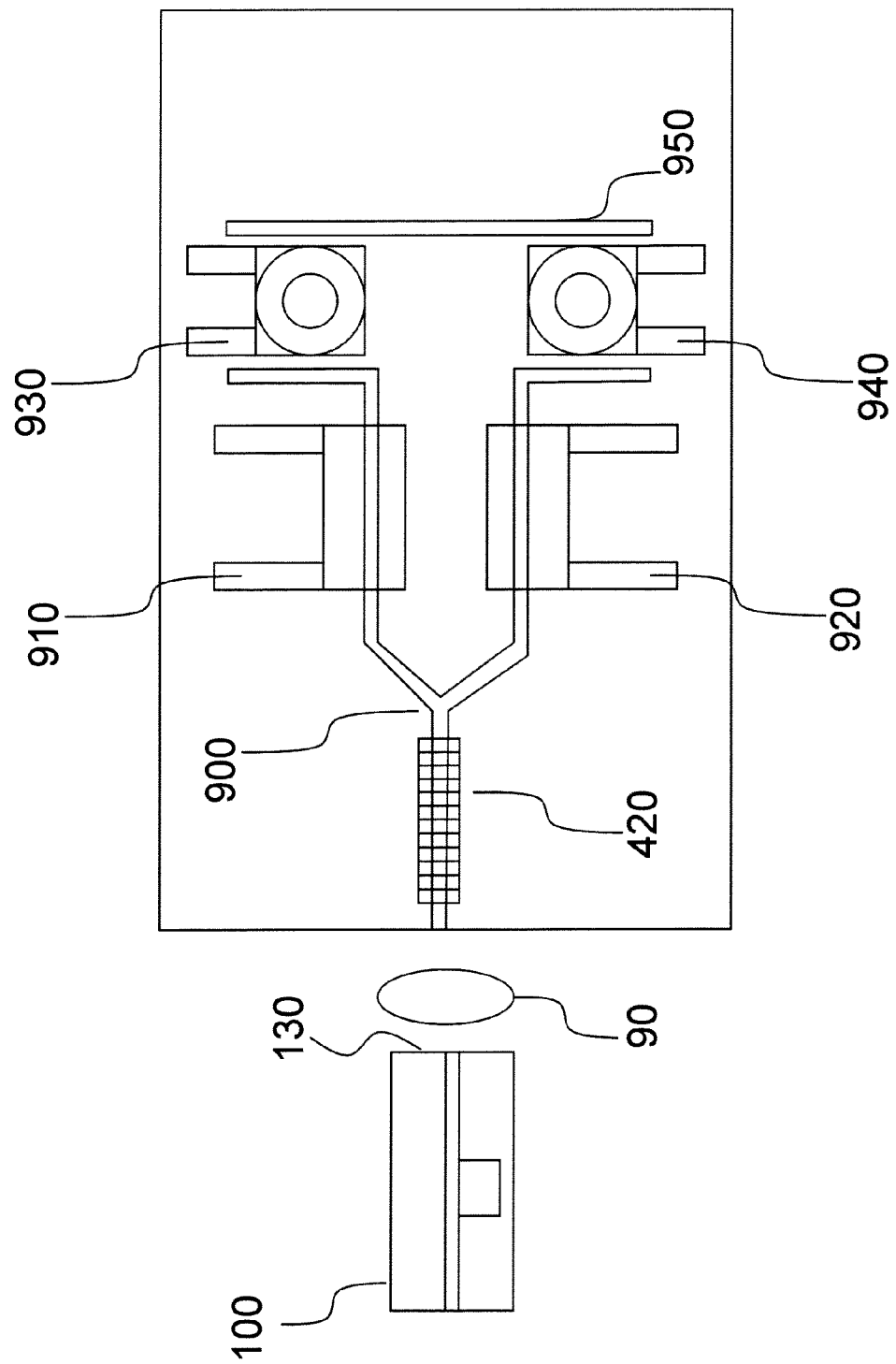

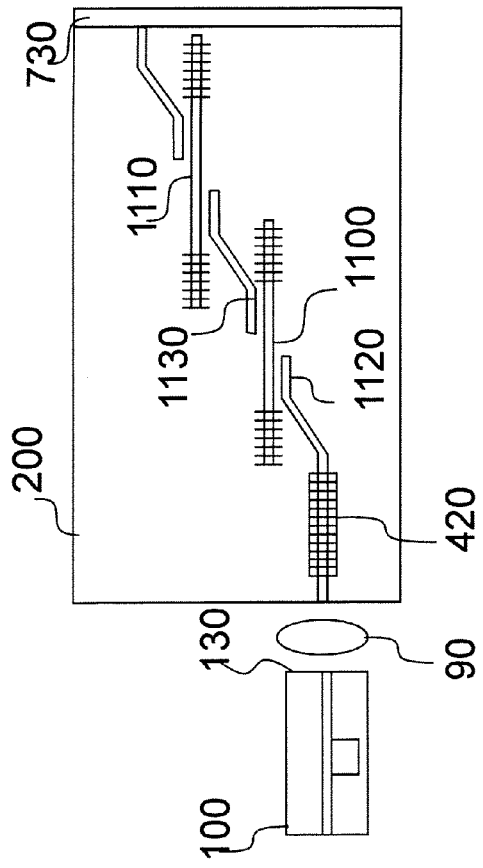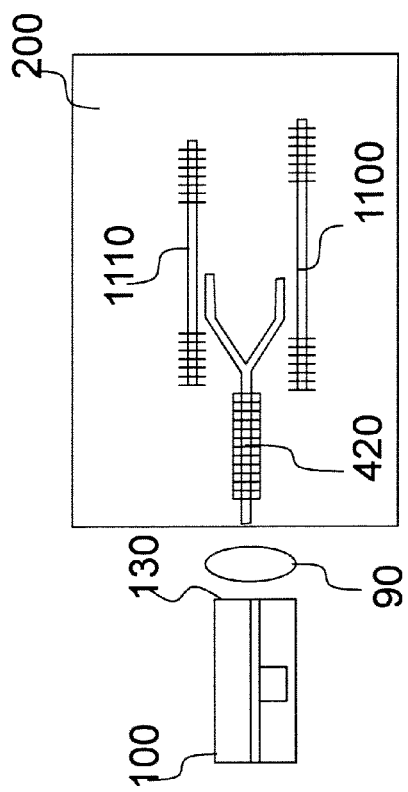
FIG. 11A
FIG. 11B

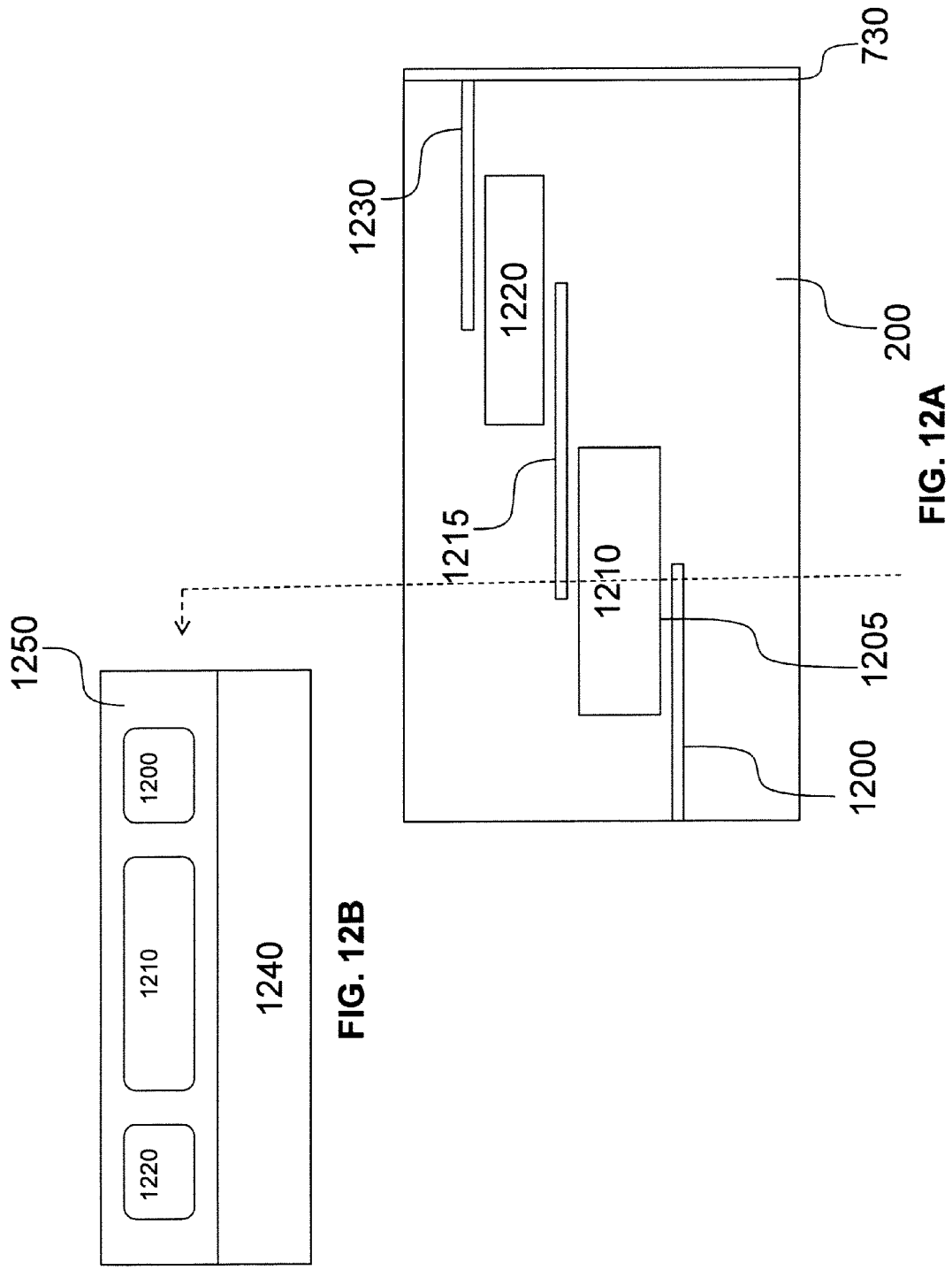

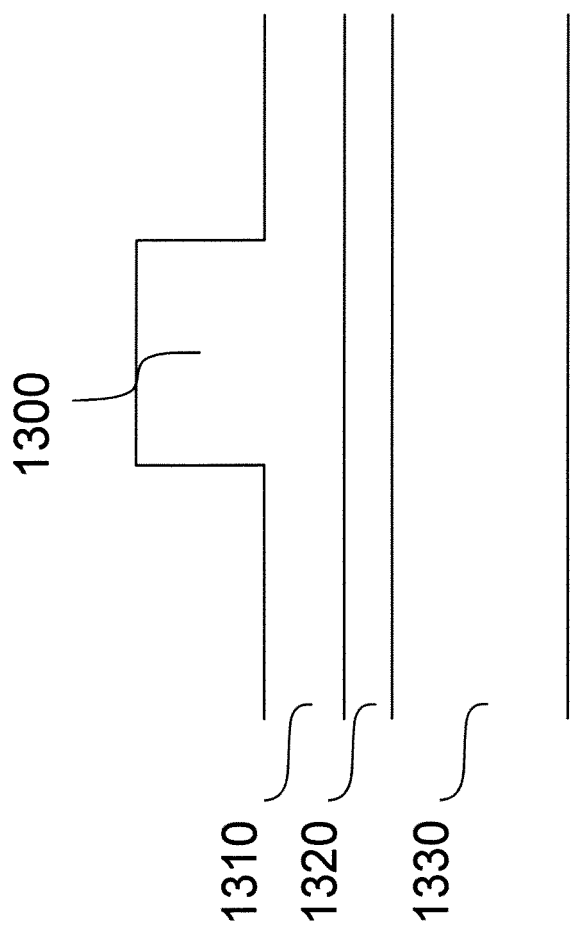

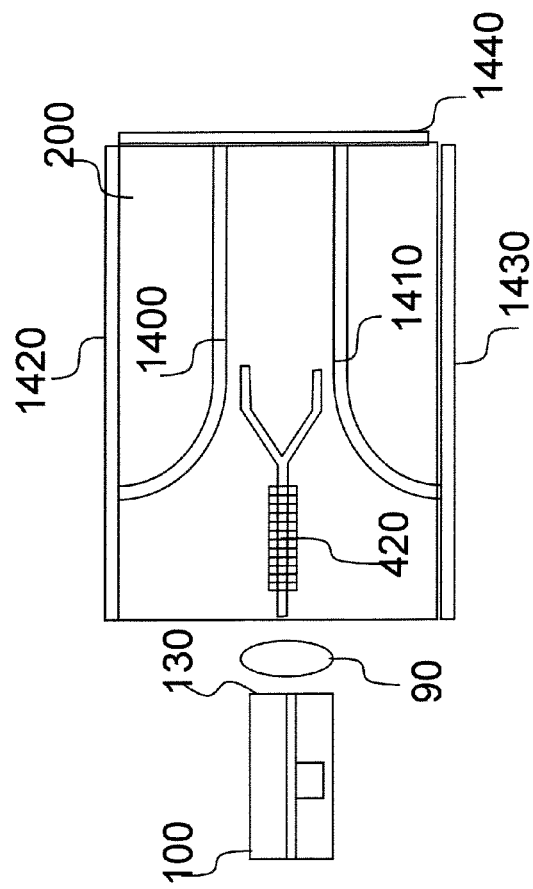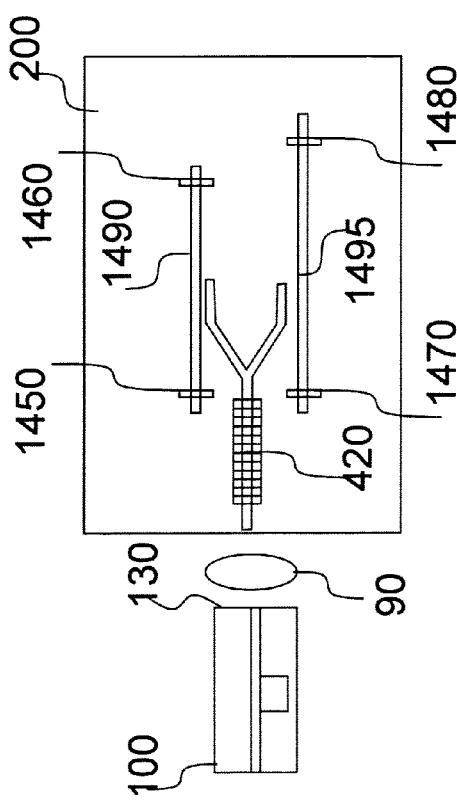
FIG. 14A
FIG. 14B

EXTERNAL CAVITY WIDELY TUNABLE LASER USING A SILICON RESONATOR AND MICROMECHANICALLY ADJUSTABLE COUPLING

CROSS REFERENCE TO RELATED APPLICATIONS

This application claims the benefit of the filing date of U.S. Provisional Patent Application No. 61/436,904, filed Jan. 27, 2011, the disclosure of which is incorporated by reference.

BACKGROUND OF THE INVENTION

The present invention relates to telecommunication laser devices in general, and more particularly to external cavity lasers with separate gain and filter sections that can provide broad wavelength tunability.

Much of fiber optic telecommunications uses multiple wavelength channels in the same fiber. Having multiple lanes in the same fiber increases the bandwidth capacity and allows rerouting or adjustment of the network by adding or dropping channels from one fiber to the next. To eliminate inventory and logistical issues of producing and servicing of dozens of lasers of different wavelengths, tunable lasers are now generally used in fiber optic networks. A single laser can provide any one of the channels needed and is frequently set to that channel at the start of deployment. A tunable laser also allows the wavelength to be changed after deployment to change the network topology. Thus tunable lasers are of great interest for multi-wavelength fiber optic networks.

Currently there are three main approaches to making a tunable laser for fiber optic network applications, each of which has some limitations in cost and complexity of manufacture. The most popular widely tunable lasers for fiber optic networks are integrated devices manufactured entirely in InGaAsP that have multiple sections. Typically one section provides the optical gain, another controls the cavity phase, and other sections provide wavelength selective feedback. Since all these sections require different geometries and must be carefully matched for proper operation, the chip yield can be low. Furthermore, with all these different elements, the chip size can be quite large, which in the expensive InGaAsP material system, also translates to higher cost. The filter sections need to have high resolution which in general translates to a large size that can sample many wavelengths of the light. Another approach is to use an external cavity configuration, where a small inexpensive InGaAsP gain chip is used, but the wavelength selective feedback comes from bulk optical components such as gratings or Fabry-Perot filters. In this case the chip cost is low, but relatively expensive other components are needed and all the parts have to be carefully aligned. The third and final conventional approach uses an array of single frequency lasers integrated on one chip, where each of the lasers operates at a different wavelength. Depending on what wavelength is needed, a single element of the array is activated. Some form of a switch or a combiner is then used to direct the light into the single output fiber. Here the complexity of the switch and the need to make many different lasers increases the cost and complexity.

A waveguide filter has been developed that instead of using gratings or couplings between dissimilar waveguides uses a ring that resonates at a set of discrete wavelengths that match the size of the ring. The diameter of the ring determines the spacing between these wavelengths (FSR—Free Spectral Range), and relatively large FSRs needed for tunable laser applications imply very small diameters. Therefore an integrated laser that uses such filters can be much smaller in size than an integrated laser that uses gratings for wavelength selective feedback. The issue is that these rings can be difficult to make in the InGaAsP material and they generally have very small optical modes that is generally incompatible with the mode in the gain section. Nevertheless, such lasers have been demonstrated.

Ring resonators have been fabricated and demonstrated in silicon, which is a much less expensive material system, and widely tunable lasers have been fabricated using an InGaAsP gain element and these ring resonators. However, optical coupling between the ring resonators fabricated in silicon with a very small optical mode and the InGaAsP gain chip with the much larger optical mode has been challenging. The high loss of the coupling has so far translated to poor performance.

SUMMARY OF THE INVENTION

Some aspects of the present invention provide a laser source that is widely tunable, simple to manufacture, and low cost.

In one aspect the invention provides an external cavity laser device, temperature controlled to produce a predominantly single output wavelength, comprising: a semiconductor waveguide chip electrically activated to provide optical gain; a second waveguide based device, of a different material and technology than the semiconductor waveguide chip, positioned to receive light of the semiconductor waveguide chip and provides a wavelength-selective optical feedback; an optical element to collect and refocus light from the semiconductor waveguide chip into the second waveguide based device and refocus the optical feedback from the second waveguide based device into the semiconductor waveguide chip.

In another aspect the invention provides a laser device, comprising: a laser gain chip; a silicon filter chip; and a lens providing optical coupling between a rear of the laser gain chip and the silicon filter chip.

In another aspect the invention provides a laser device, comprising: a laser gain chip; and a silicon filter chip configured to provide optical feedback to the laser gain chip, the silicon filter chip having a filter including at least two Fabry-Perot (F-P) cavities.

In another aspect the invention provides a laser device, comprising: a laser gain chip; and a silicon filter chip configured to provide optical feedback to the laser gain chip, the silicon filter chip having asymmetric waveguides of dissimilar material.

Some aspects of this invention provide a laser source that has optical properties suitable for long distance single mode fiber optic communications. This includes high sidemode suppression ratio, high optical power, narrow linewidth, and low electrical power consumption.

In some aspects the invention includes a simple semiconductor gain chip and a waveguide filter fabricated in silicon, which are optically coupled together with a lens. The silicon filter feeds back one specific wavelength into the gain media of the gain chip, and that wavelength can be adjusted by electrically or thermally tuning the silicon filter.

The silicon filter can use a variety of structures to provide feedback into the gain chip. A preferred embodiment uses two ring resonators with slightly different FSRs, such that only one peak of one filter overlaps another peak of the other filter. By tuning the two elements, the wavelength where two peaks overlap can be adjusted over a wide wavelength range.

Optical coupling between the filter and the gain chip may be realized with a microlens. The position of this lens may be adjusted using micromechanical levers that allow precise control of the position of the lens. Once the lens is appropriately positioned, the levers are locked down such that the position of the lens is now fixed.

In addition to the lens, the silicon filter could also incorporate a grating coupler, such that the lens can precisely adjust the angle of the beam for maximum coupling of the light into the grating coupler and therefore into the waveguide of the silicon filter.

These and other aspects of the present invention are more fully comprehended from a consideration of the following detailed description with reference to the accompanying drawings.

BRIEF DESCRIPTION OF THE DRAWINGS

The present invention is illustrated by way of example, and not limitation, by the figures of the accompanying drawings in which like references indicate similar elements and in which:

FIG. 9B is a top view schematic of a laser assembly using two ring resonators in a series, or loop, configuration together with a y-branch coupler;

FIGS. 11A and B show top view schematics of a laser assembly using two linear resonators with high index gratings at both ends;

FIGS. 12A and B are a top view and cross sectional view of a silicon filter with two resonators using coupling between dissimilar waveguides that act as resonators;

FIG. 13 illustrates a cross-section of an example waveguide; and

FIGS. 14A and B show top view schematics of a laser assembly using resonators bounded by mirrors in accordance with aspects of the invention.

DETAILED DESCRIPTION

Figure 1:
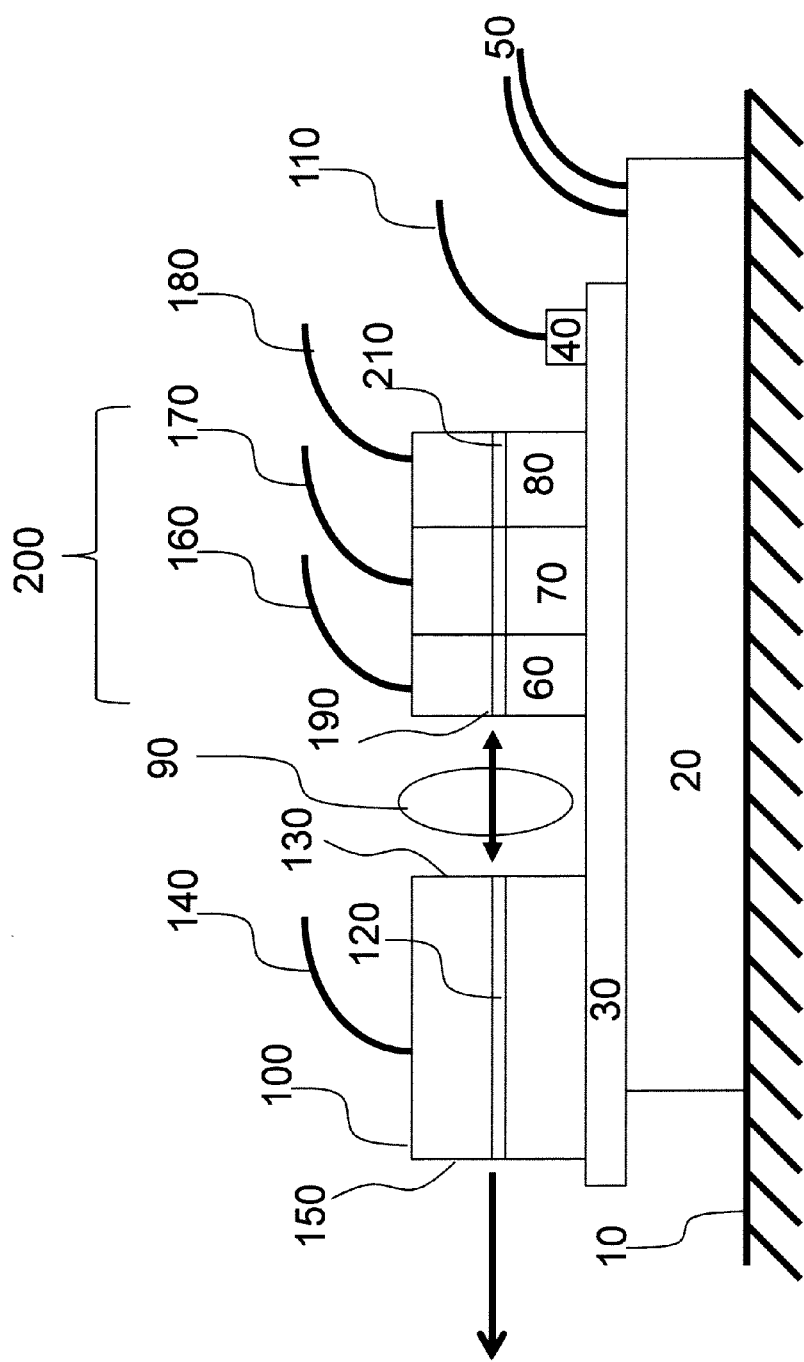
FIG. 1 is a schematic of a preferred embodiment of the external cavity laser.

FIG. 1 schematically illustrates a simple embodiment of the invention. A heatsink 10 is connected thermally to the environment and provides cooling for a module. The module itself is temperature controlled using a thermoelectric cooler 20 which is connected to the heatsink 10. A thermistor 40 monitors the temperature of a carrier 30 coupled to the thermoelectric cooler. If the temperature becomes higher than the desired temperature, current is supplied through wires 50 to the thermoelectric cooler 20 such that heat is removed from the carrier 30. If the carrier 30 becomes too cool, the current to the thermoelectric cooler is either reduced or reversed in direction such that the temperature of the carrier 30 and the topical components mounted on the carrier are generally constant. The temperature reading of the thermistor is monitored by measuring its electrical resistance using wire 110.

An external cavity laser assembly is bonded to the temperature controlled carrier 30 and is comprised of three elements: a laser gain chip 100, a microlens 90, and a silicon filter chip 200. The laser gain chip is generally fabricated in InGaAsP material for operation in the 1550 nm band for fiber optics. The laser gain chip contains a waveguide 120 and is antireflection coated on a rear of the chip 130. A front of the chip 150 is coated for a low but finite reflectivity and provides a front facet of the lasing cavity laser gain. Typical front reflectivity might be 10%, and rear reflectivity less than 0.5%. Optical gain is provided in the laser by injecting current into wire 140 to forward bias a pn junction in the cavity. The light from the back of the gain chip 100 is collected and focused by the microlens 90 onto a waveguide 210 of the silicon filter chip 200. This silicon filter chip has three separate sections, each of which can be adjusted. A phase control section 60 adjusts the phase of the lasing cavity. The refractive index of this region can be adjusted by applying current through electrical contact 160, and generally the phase is adjusted such that a longitudinal Fabry-Perot mode of the cavity matches the maximum reflectivity of the silicon chip filter. The two other sections, 70 and 80 are filters with multiple reflectivity peaks. The FSR of the filters is slightly different such that only one peak of one filter overlaps with the peaks of the other filter. By adjusting the refractive index of the filters slightly, the wavelength of overlap can be adjusted across a wide tuning range. The position of the filter peaks in sections 70 and 80 can be adjusted by applying electric current to the contacts 170 and 180, respectively. The silicon filter chip is antireflection coated on the front facet 190. When one of the filter peaks of sections 70 and 80 are matched to the phase of the cavity, the external cavity laser will produce light emanating from the front facet 150.

The microlens 90 provides good optical coupling between the gain chip 100 and the silicon filter chip 200. Generally the waveguide mode size of the gain chip 120 is larger than the waveguide mode size of the silicon filter chip 210 and simply putting the two chips together and lining up the waveguides (butt-coupling) is not effective. The lens, on the other hand transforms one mode into the other and can provide high efficiency optical coupling between the two chips. Given that the waveguide modes are quite small, good control over the position of the lens is preferred.

Figure 2:
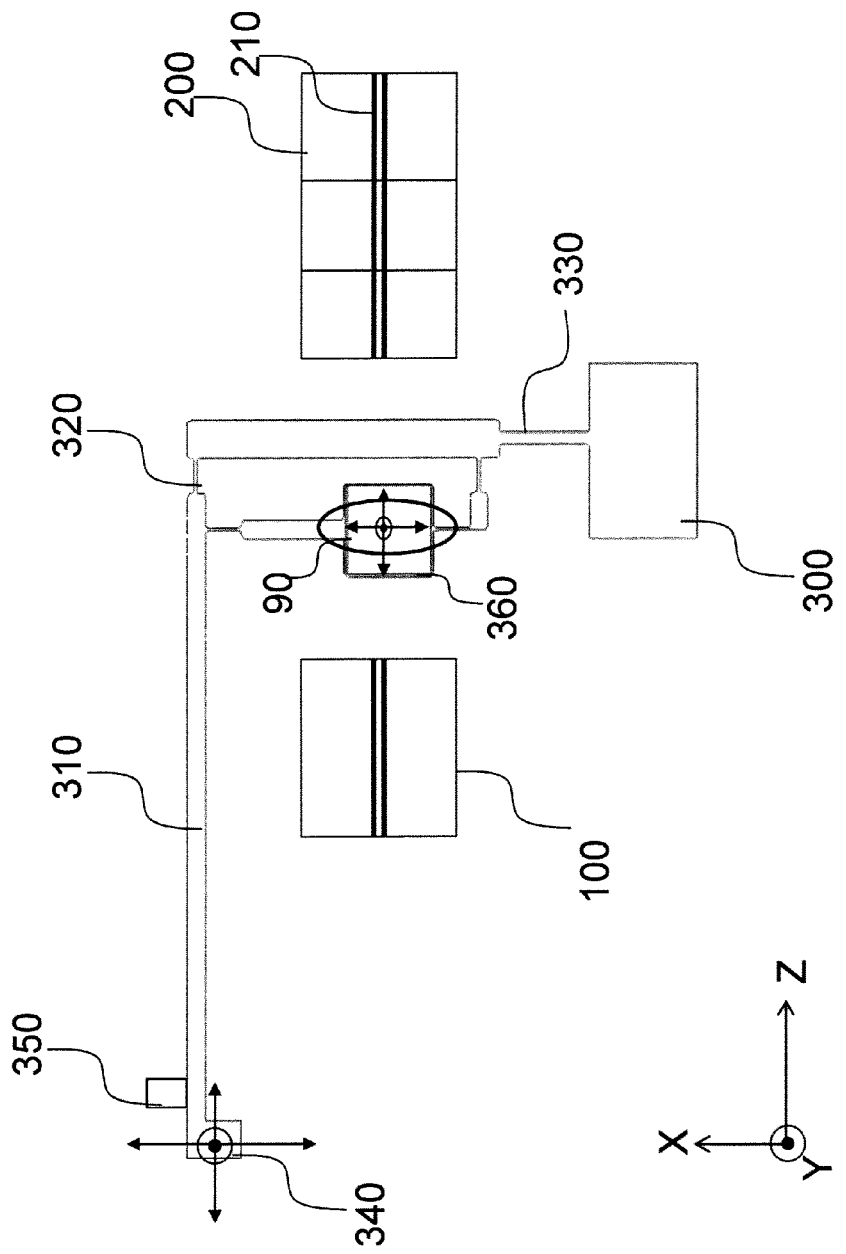
FIG. 2 shows a top view of the assembly, where the lens position can be micromechanically adjusted.

To get good alignment and coupling between the gain chip 100 and the filter chip 300, precise alignment of the lens 50 is preferred. FIG. 2 shows how micromechanical structures either etched or attached into the carrier 30 can provide control over the positioning of the lens. In this figure the lens 90 is attached to a movable stage 360. The position of this stage can be controlled by adjusting a handle 340 positioned away from the stage and connected to the stage with a series of levers and springs. Initially the handle 340 is loose while the assembly is connected to the base (for example the carrier 30 or a substrate on the carrier) through an immovable pad 300. In this example as the handle 340 is manipulated in the three axes, the mechanics is such that the lens moves along the same directions, but at a reduced distance. Thus exquisite control over the position of the lens is obtained with relatively rough manipulation of the handle. For example, if the handle is pushed in the Z direction the spring 330 bends and the lens moves away from the gain chip 100 and towards the silicon filter chip 200. If the handle 340 is moved in x direction, then spring 320 bends, and the lens 360 moves laterally up the page in the x direction. In both cases, the amount of motion of the lens is reduced compared to the motion of the handle. Once optimal alignment has been obtained, the assembly is locked down close to the handle using a tab 350. This can be done using solder molten with an integrated heater on the carrier.

Figure 3:
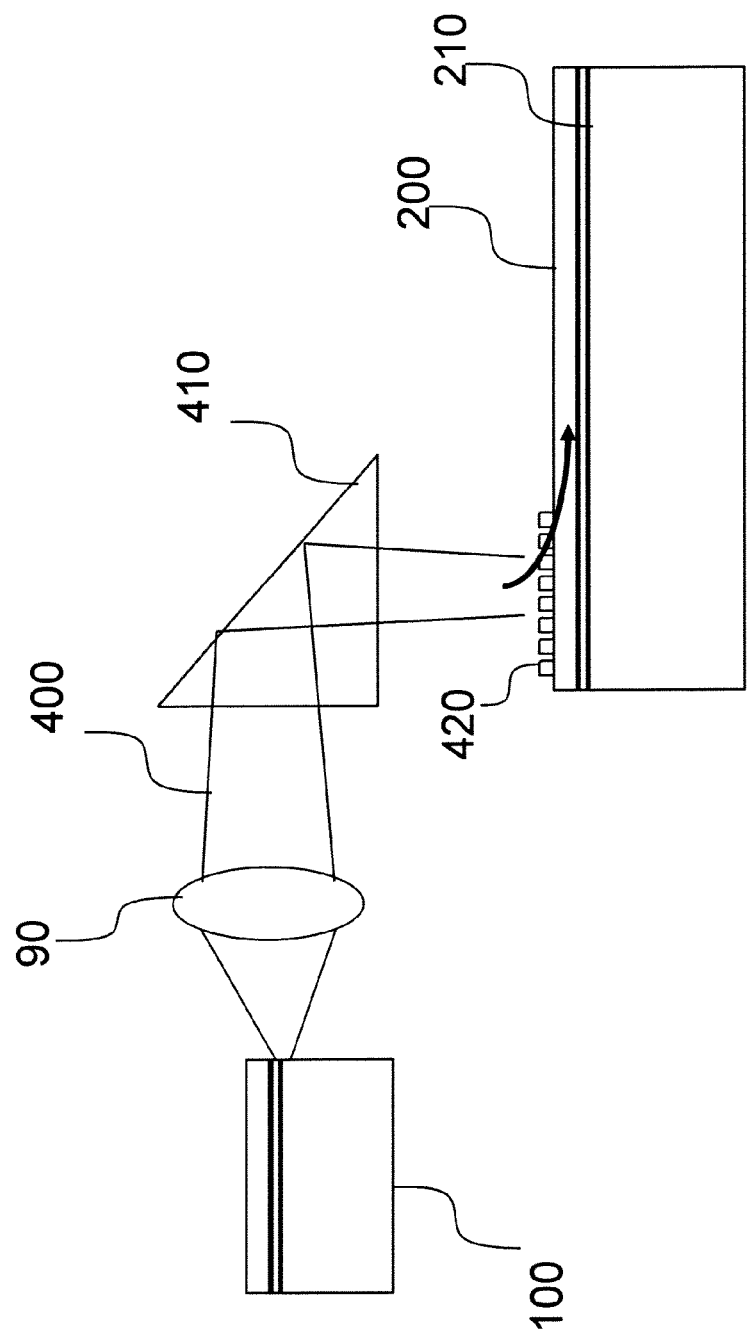
FIG. 3 is a side view of the assembly showing a prism reflecting light down onto a grating coupler on the filter chip.

The addition of a surface grating coupler can further ease the optical alignment between the gain chip and the silicon filter chip. This is shown in FIG. 3. Once again the gain chip 100 puts out an optical beam 400 that is manipulated with a microlens 90. However, rather than focusing the optical beam directly on the facet of the filter chip 200, a surface grating 420 is formed on the silicon filter chip 200. This grating is fabricated such that the optical energy is coupled into the waveguide 210. Such technology is known in the industry and is usually used to couple light from an optical fiber directly into a silicon photonic chip. To keep things planar, an additional mirror or prism 410 is used to deflect the light onto the grating. Note that the lens 90 can be adjusted such that the beam is incident at any angle or degree of collimation when it hits the grating. This allows the coupling efficiency, and optical coupling wavelength to be adjusted.

Figure 4:
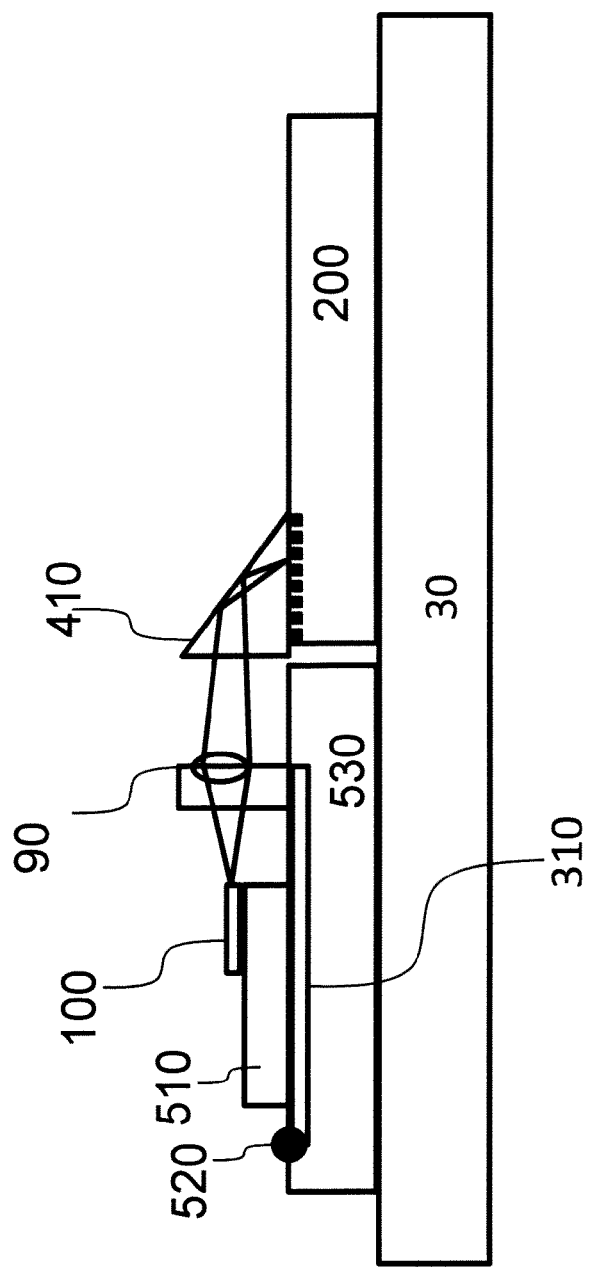
FIG. 4 is another side view of the assembly showing how various carriers can be used to adjust the heights.

FIG. 4 shows the assembly of FIG. 3 including the various carriers. In this case the vertical offset between the gain chip 100 and the filter 200 is realized with an additional carrier 510. Using a separate carrier for the laser allows the laser die to be tested and burned in prior into assembly into the package. Additionally, a separate chip 530 is used to form the micromechanical linkages to move the lens, and this separate MEMS chip is mounted on the common carrier 30. The magnification of the lens is chosen to be approximately equal to the ratio of the grating coupler input mode size to the laser diode mode size. Once the lens position has been optimized by moving the lever arms 310, the arms are locked in position with solder 520.

Figure 5:
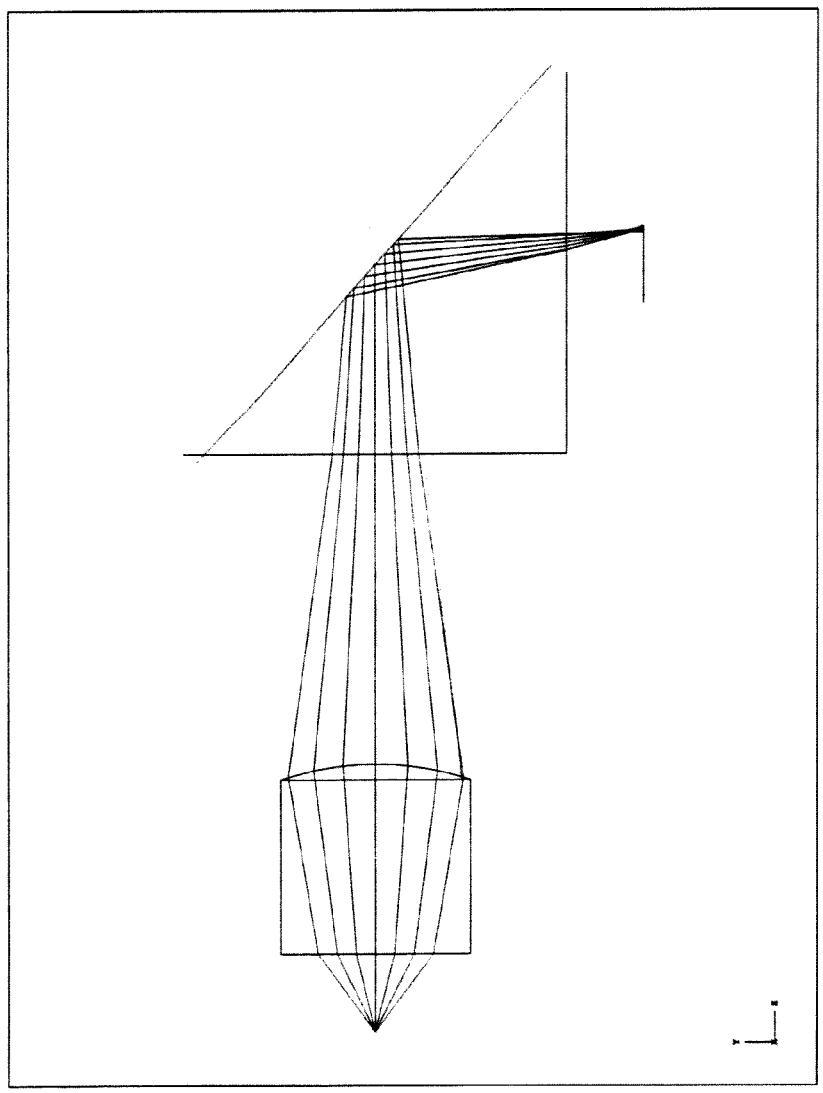
FIG. 5 is an optical ray trace of the lens and prism used to couple the light onto the grating coupler.

FIG. 5 shows an optical ray trace for the coupling. In this embodiment, the lens is a plano-convex asphere fabricated in silicon using wafer-level processing. Such a lens can be made with small overall dimensions and highly accurate mechanical tolerances. The curved surface has a radius of curvature of 0.35 mm and a conic constant of −2.6. The magnification is chosen for efficient coupling from a typical InP laser diode to a grating coupler mode-matched with single mode fiber. The prism is made from BK7 with an angle such that the cone of light incident upon the grating coupler is at an angle of 10 deg. This matches typical available coupler designs. The total distance from the lens to the grating coupler is approximately 1.1 mm.

Figure 6:
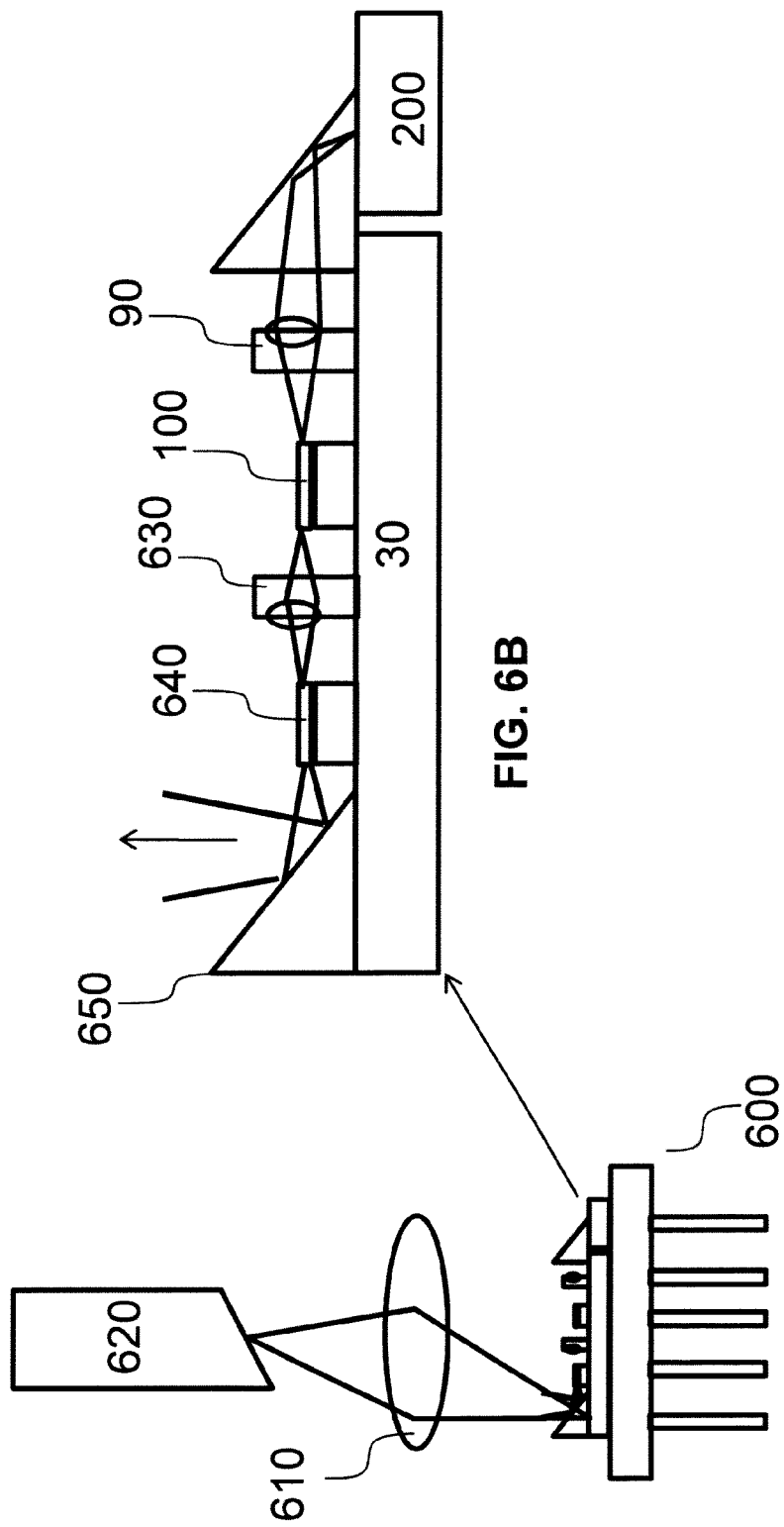
FIGS. 6A and B show how an assembly including a separate modulator can be packaged into a standard optical TO can.

FIG. 6 shows a low-cost packaging approach for such a tunable laser, including a modulator for carrying data and with micromechanical coupling on both the input and output of the gain chip. In this case, the common carrier for the MEMs chip and the silicon photonic chip is a TO header 600. Electrical connections can be made by wire-bonding from the chips to feed-throughs in the header. A metal cap can be placed on the top of the header. The cap may include a lens 610 for imaging the mode of the output coupler to a single-mode fiber 620. The end-face of the fiber is angled in order to both minimize back-reflection at the interface and to match the angle of the beam. The assembly is shown in 6B, where the structure previously described is combined with a modulator 640. An external cavity laser can be directly modulated but higher performance and lower chirp can be obtained if a separate modulator chip is used. The output of the InP gain chip is collected and refocused with a second microlens 630 that can be micromechanically adjusted, for example with structure as described previously, and reimaged onto a modulator 640. In the simplest case, this can be an electro-absorption modulator that adjusts the intensity using shifts in the semiconductor bandgap, or in can bean interferometric modulator, such as a Mach-Zehnder device that uses phase adjustment. The light usually exits the modulator from the other side, and in this case we use a second mirror or prism 650 to deflect the beam vertically.

The widely tunable optical filter 200 can be implemented in waveguide form in many ways, including sampled Bragg gratings, as reported in Akulova et al. "Widely tunable electroabsorption-modulated sampled-grating DBR laser transmitter," IEEE Journal of Selected Topics in Quantum Electronics, vol. 8, pp. 1349-1357 (2002), the disclosure of which is incorporated by reference herein, and grating assisted couplers. Recent improvements in fabrication technology have made the ring resonator a very attractive candidate, given its simplicity and small footprint.

A ring resonator comprises a waveguide in a closed loop, with bus waveguides close by to couple light into and out of the ring. Light is coupled efficiently to the ring from the input bus waveguide when the circumference of the ring is equal to an integer multiple of the wavelength of the light in the waveguide from which the ring is fabricated. A second bus waveguide can be used as an output guide, with resonant coupling of light from the ring in an analogous manner to the coupling from the first waveguide. This arrangement therefore forms a transmission filter in which resonant wavelengths are coupled from the first waveguide to the second, but other wavelengths remain in the first waveguide.

There are many parameters available to the designer in order to optimize a ring resonator filter for a particular application. The width of the resonant peak depends on the circumference of the ring and the coupling coefficient between the ring and bus waveguides, which can be adjusted by the design of the waveguide and the distance between the two waveguides in the coupling regions. The wavelength spacing between resonant peaks, or free spectral range, is inversely proportional to the circumference of the ring. For example, a ring with 500 micrometer diameter in a silica waveguide would have a free spectral range of approximately 1 nm.

A desirable tuning range for a widely tunable laser is on the order of 35 to 45 nm, in order to cover the entire C-band around 1550 nm. Ring resonators can be tuned thermally, since the refractive index, and hence the optical path length around the ring, varies with temperature. In order to achieve the full tuning range with a single ring, the temperature tuning range would be a few thousand degrees in silica or a few hundred degrees in silicon. Furthermore, the free spectral range should be significantly larger than the tuning range, which would bring the ring diameter down to below 5 microns, which would be too small to allow low optical losses in current technology.

A more manufacturable approach to broad tunability is to use two thermally tuned ring resonators in series, with slightly different free spectral ranges for each ring. The rings would be tuned so that transmission resonances line up at the desired wavelength. In a published example Chu et al., "Compact, low power consumption wavelength tunable laser with silicon photonic-wire waveguide micro-ring resonators," European Conference on Optical Communications (ECOC) paper 7.2.1, (2006), the disclosure of which is incorporated by reference herein, the rings had free spectral ranges around 5 nm and 5.5 nm. The full wavelength band is covered by Vernier tuning. This approach has two big advantages over using a single ring: first, fabrication of the ring with smaller free spectral range and larger diameter is far more practical, and the optical losses from the bending of the waveguide can be negligible; second, the tuning range for each ring is reduced by an order of magnitude, which keeps the temperature tuning range manageable. Two rings are sufficient for waveguides made from materials of high refractive index, such as silicon, indium phosphide, or other semiconductors. If a lower index material such as silica glass is used, the minimum ring diameter for low optical loss is greater than for high index materials, so the free spectral range of each ring is smaller. In such materials it is generally desirable to add a third ring in order to obtain the desired spectral selectivity.

Figure 7:
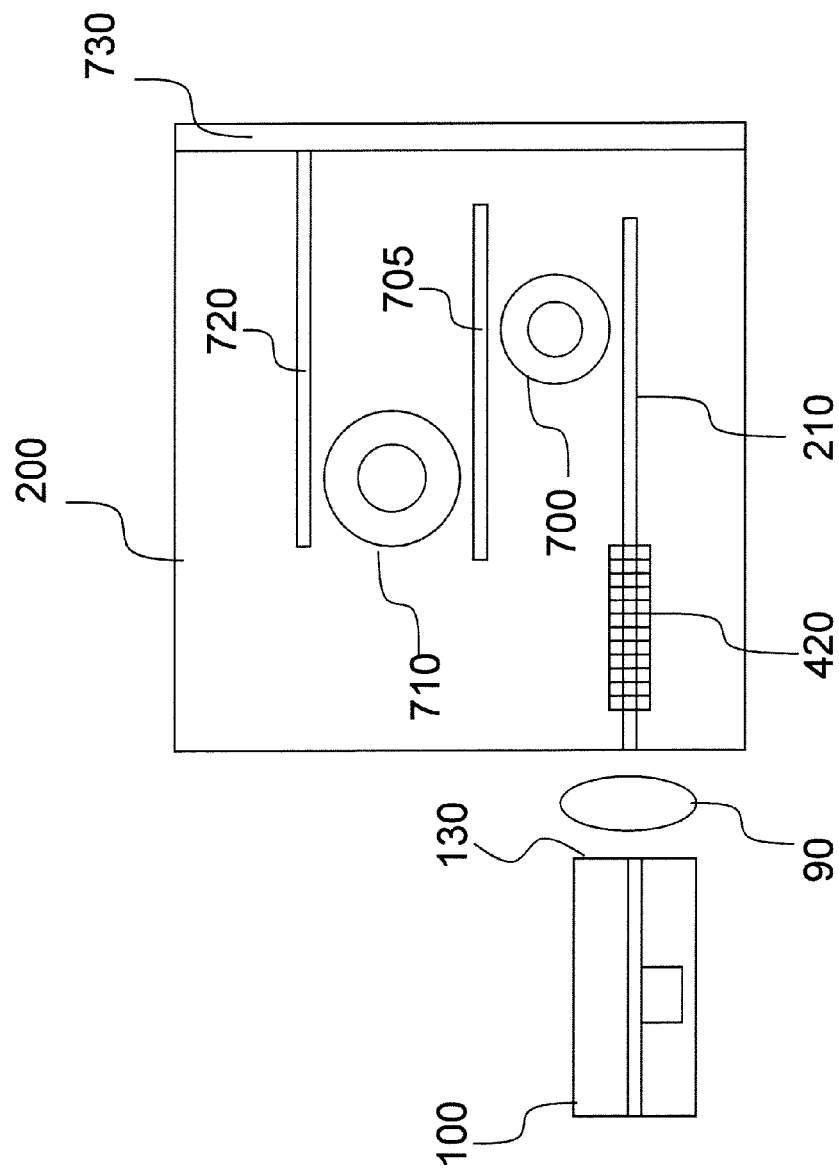
FIG. 7 is a top view schematic of the laser assembly using two ring resonators in series as the wavelength selective filter.

FIG. 7 shows a schematic of the external cavity laser with a double ring resonator as described above. The gain chip 100 has an anti-reflection coated back facet 130. The lens 90 couples the light to a grating coupler 420 through a prism (not shown) and the light enters the waveguide 210. All the light that stays in the waveguide is lost since the waveguide is not terminated at the other end, but certain peaks corresponding to the resonances of the adjacent ring resonator 700 couple out of this waveguide 210 and enter an intermediate waveguide 705. Only light that is resonant with a second ring resonator 710 is coupled out of this intermediate waveguide 705 and makes it to the extreme waveguide 720. That light propagates to the back mirror 730, is reflected, and makes its way back to the gain chip 100 in the reverse of the just discussed path. The back mirror, which effectively is the end of the lasing cavity is polished silicon that is HR coated.

The chip can be tuned by adjusting the refractive index of the two rings 710 and 700, and the phase of the reflectivity can be controlled by adjusting the refractive index of one of the straight waveguides, such as 210, 705, or 720. The simplest way is perhaps to use a heating electrode above the part and raise the temperature locally.

Figure 8:
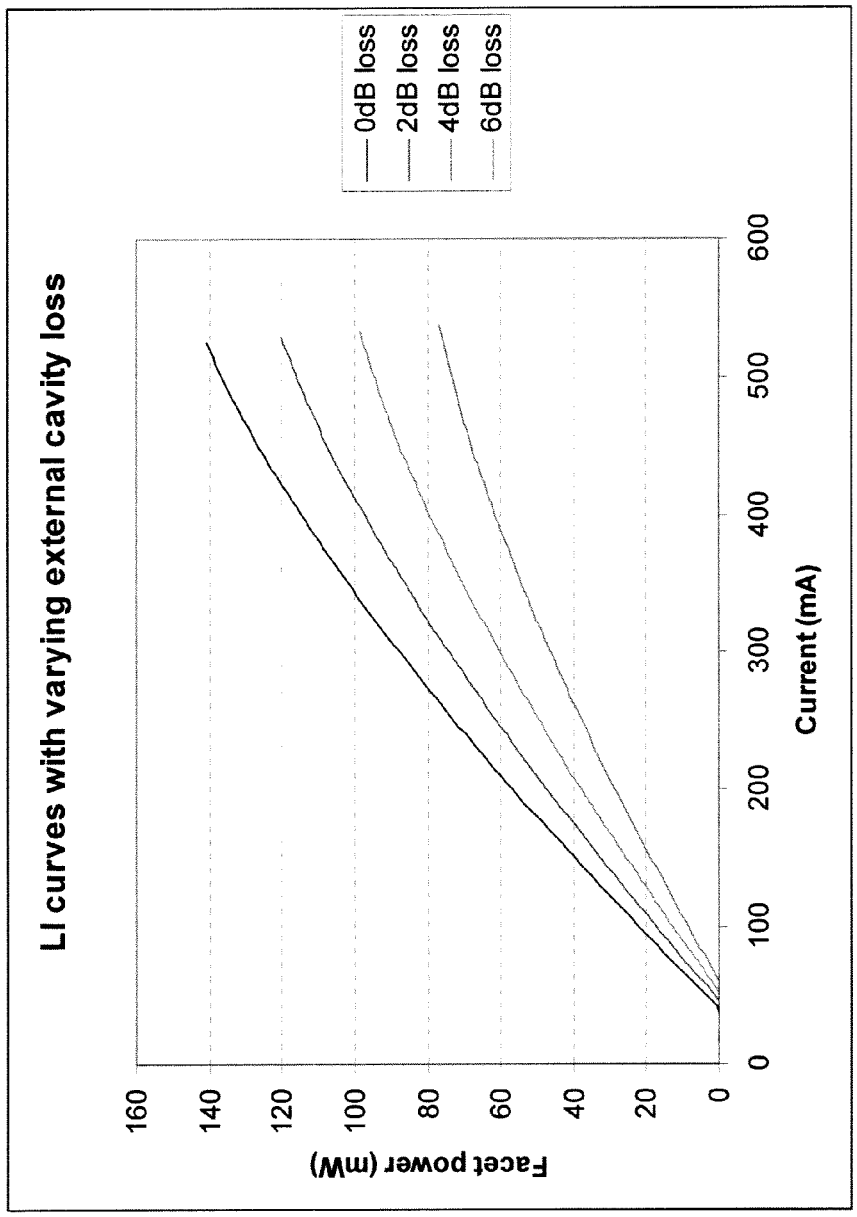
FIG. 8 is a calculation of the output power of such a laser as a function of different total filter loss.

The entire wavelength selective filter can be quite efficient. Relatively conservative assumptions are that the coupling efficiency of the grating coupler is 70%, and the transfer between the ring resonators is 90%. Assuming negligible waveguide loss and a good HR coating on the back, the total reflectivity back in to the gain chip becomes (0.7×0.9×0.9)^2=30% or about 5 dB. This is equivalent to a semiconductor/air interface. With the light taken out of the front of the chip, one can obtain high optical powers from such a device. FIG. 8 shows a calculation of the front power of such a semiconductor laser with different values of loss from the rear wavelength-selective filter. One can see that even with 6 dB loss, 80 mW of optical power can be obtained at 500 mA. For the purposes of this simulation, we assumed a 1 mm long gain chip with a 10% front facet reflectivity. This is less about a factor of two less than if there was no filter loss at all.

Figure 9A:
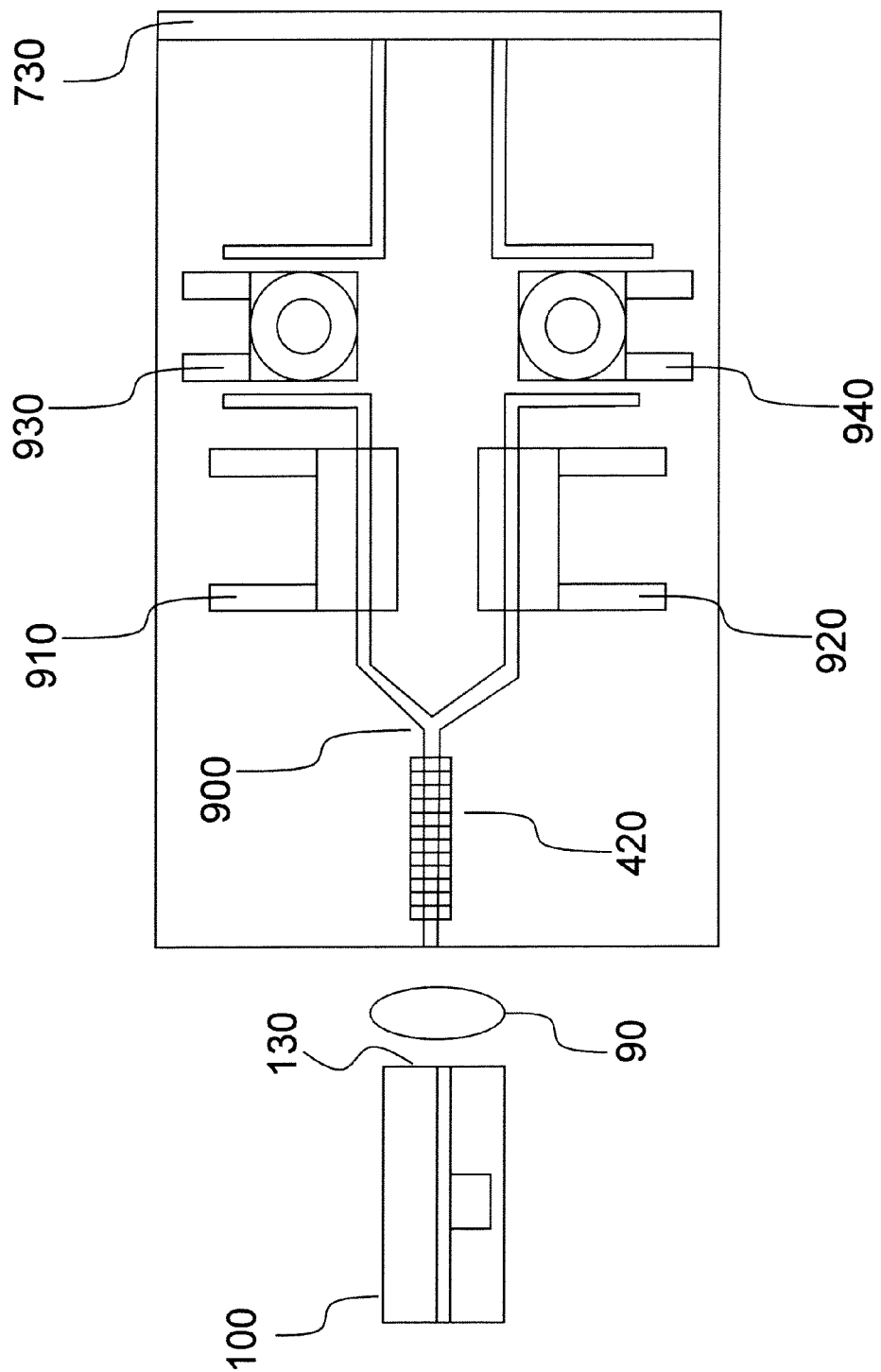
FIG. 9A is a top view schematic of a laser assembly using two ring resonators in parallel, together with a y-branch coupler.

There are other configurations of ring resonator or other filters that can also be used in aspects of this invention. In FIG. 7, the two ring resonator filters were put in series, such that the light must pass through both, reflect from the back mirror 730, and retrace its steps into the gain region of the laser. In this case, since the filters are in series, their response is multiplied together to calculate the feedback into the gain region. Alternatively, the filters can be placed in parallel, such that their response is summed. FIG. 9A shows such an implementation. The light is once again generated in a gain chip 100 and exits out of an AR coated rear facet 130 and is focused with a microlens on a grating coupler 420. In this case however, the light is split into two by a y-branch or directional coupler 900 and enters two separate filter sections. These filters may have individual phase adjustors 910 and 920, and each filter includes a different ring resonator 930 and 940. Both these filters can be tuned thermally using heaters that are lithographically processed on the rings. The output of these filters then reflects from the end facet 730 that is HR coated and retraces the path into the gain chip. FIG. 9B shows an alternative implementation that does not utilize a back mirror, such as provided by the end facet 730 of the device of FIG. 9A. The embodiment of FIG. 9B uses waveguide 950 to connect the two rings in a loop configuration so that light from each ring travels through the other ring, with the result that the light travels through both rings, in order for the light to return via coupler 900 to the gain chip.

Since ring resonators fundamentally should have low bend loss despite their very small bend radius, very narrow waveguides, with width and height typically less than 1 micron, are used for rings with a high index contrast between core and cladding. The small modes in rings mean that at high optical powers non-linear phenomenon, like two photon absorption, can degrade performance. Therefore it is advantageous to use resonant structures based on straight waveguides which can be fabricated in silicon with width and height of a few microns. The optical power density is lower in such waveguides than in the sub-micron waveguides typically used for ring resonators, so non-linear phenomena do not occur until much higher optical power.

An example cross-section of such waveguides is shown in FIG. 13. A partially-etched waveguide 1300 is formed in a silicon layer 1310, typically 1 to 5 microns thick, on top of a layer 1320 of material with lower refractive index, typically silicon dioxide, that is formed on a base wafer 1330, typically silicon. High-contrast waveguides with dimensions of a few microns can also be created in layers containing blends or combinations of silicon oxide and silicon nitride, for example. A tunable laser whose reflector is formed in waveguides with these larger may be able to handle higher output powers of light.

A further advantage of larger waveguides is that optical coupling is easier, with greater tolerance. Conventional end-fire coupling may well be preferred over grating couplers for such waveguides. The waveguides can also be designed so that the optical mode size is similar to that of the gain chip. In this case it may not be necessary to use a lens, and the gain chip can be placed close to the input facet of the reflector for direct optical coupling. If the micromechanical adjustable assembly is used, in some embodiments the gain chip or the reflector can be placed on the movable part.

Figure 10:
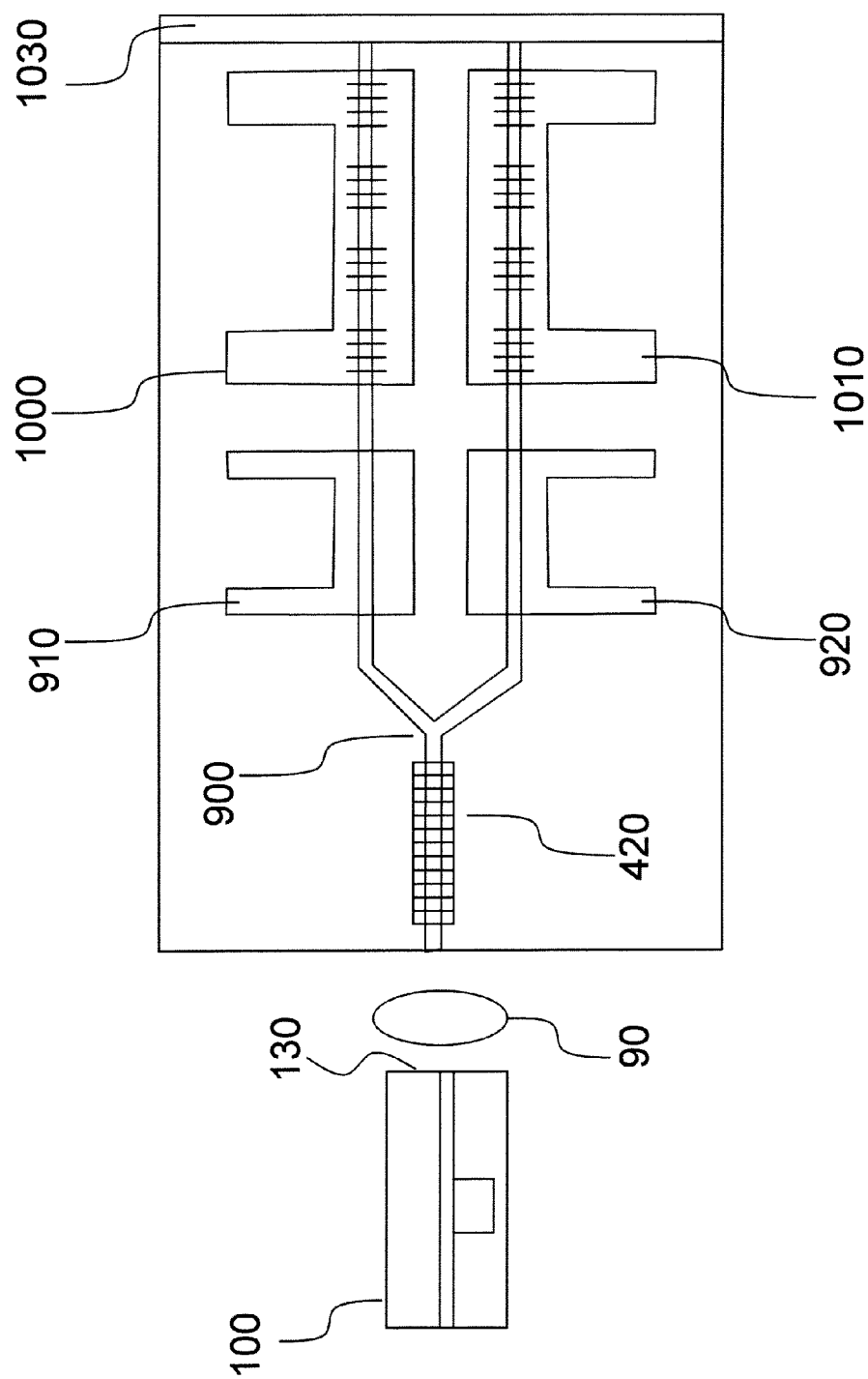
FIG. 10 is a top view schematic of a tunable laser assembly using two sampled gratings in parallel.

One example of a resonant reflector that can be formed in straight waveguides is a sampled grating. A sampled grating based tunable laser in accordance with aspects of this invention is shown in FIG. 10. The sampled gratings can be placed in series or in parallel. FIG. 10 shows a parallel architecture, where the light from the gain region is once again split into two arms via a y-junction or a directional coupler 900. The phase of each arm can be individually controlled with phase adjustors 910 for the upper arm and 920 for the lower arm. The light then enters two sampled grating reflectors 1000 and 1010 that have a periodic reflectivity spectrum. Like the ring resonator case, the two spectra have slightly different FSR, such that only one peak of one spectrum superimposes on the other's. The reflectivity spectra can be shifted either with thermal tuning using heaters, or by current injection with pn junctions. Since sampled gratings are reflective, there is no need for an HR coating at the back of the chip. Actually, an antireflection coating 1030 would be preferred so as to avoid causing interference with the reflectivity of the gratings.

Sets of periodic reflection peaks can also be obtained from linear resonators where the periodicity stems from longitudinal modes of a cavity. Combining two such devices can provide the same or similar functionality as that provided by ring resonators or sampled gratings.

FIGS. 11A and B show a pseudo-schematic where, instead of ring resonators, linear F-P cavities are used. Once again a grating coupler 420 or alternatively simple end-butt coupling, is used to focus light from the gain chip 100 through a microlens 90 into a filter chip. This chip contains two resonators 1100 and 1110 that have strong reflective gratings, or alternatively etched facets coated to give high reflectivity at the two ends of a waveguide. Such strong gratings can be realized by etching through the entire waveguide, thus giving an index contract of 2.5 for silicon/air. These grating reflectors will be very broad band and can give very high reflectivity in a short length. In FIG. 11A, a small directional coupler structure 1120 taps power into this resonator. Only the longitudinal modes that meet the phase matching condition resonate and build up in the cavity. An exit port 1130 taps power of this cavity and couples it into a second resonator 1110 that has a slightly different length cavity and thus a slightly different FSR. Light from this resonator is tapped out, reflects against an HR facet 730 and then traces the same route through the two resonators back into the gain chip. These linear resonators, similar to ring resonators can be tuned with temperature (temperature dependent refractive index), current (carrier dependent refractive index), or voltage (electro-refraction effects), such the position of the resonator peaks can be varied electrically, and broad band tuning obtained. In FIG. 11B, the two resonators are shown in a parallel configuration. The interaction lengths between the directional coupler 1120 and the two resonators are such that the light that is resonant in the cavities of 1100 and 1110 are each reflected back. Similar to FIG. 10, no high reflectivity coating is needed at the back of the chip. Individual phase control regions (910 and 920 in FIG. 10) may also be useful here, but are not shown in FIG. 11.

The resonator can also be fabricated somewhat laterally to the direction of propagation through the chip, based on wavelength dependent coupling between highly asymmetric waveguides. An example is shown in FIG. 12. In this case the light coming into silicon filter chip 200 enters from a low index waveguide 1200 made of germanium doped silica. This waveguide, and other structures are all surrounded by a low index cladding 1250 made of undoped silica. The light then couples to a silicon waveguide 1210. Because the refractive index is much higher in the silicon rather than silica, a high index mode of the silicon waveguide is excited. The matching between the silica waveguide and the silicon waveguide has a periodic nature based on the order of the mode excited in the silicon waveguide 200, and wider waveguides give more closer spaced modes or smaller FSR. The light then couples out of this resonator into another silica waveguide 200 and couples to a second resonator 1220 and out again out of waveguide 1230. Like previous structures, the light is reflected from the end mirror 730 and retraces its steps back into the gain chip. FIG. 12B gives a cross section of the structure showing the silicon substrate 1240 below, the high index silicon resonator waveguide 1210 and the input silica waveguide 1200 and the output silica waveguide 1220. The mathematics of such wavelength dependent coupling between highly asymmetric waveguides are well known, and the thickness and coupling lengths can easily be calculated. In general the width of the multimode silicon guides is on the order of a couple of hundred microns for a few nanometer FSR, and the coupling lengths between silica and silicon waveguides are on the order of a half a millimeter for a resolution of a few tenths of a nanometer. Like previous embodiments, the resonance of these filters can be controlled by using heaters to modify the temperature, injecting current to adjust the carrier density, or reverse biasing a pn junction in the structure to change the field and create electro-refractive effects.

A minor modification to FIG. 12 would be to add gratings in the coupling regions to change the phase matching conditions. These gratings can couple counter propagating beams, such that the light from input waveguide 1200 is coupled to waveguide 1210, but going in the opposite direction. This can be realized with a tight grating which increases the resolution of the filter for a given size.

The embodiment illustrated in FIGS. 11A, B uses grating reflectors to form the mirrors of the resonant optical cavity. An alternative form of mirror is a smooth end facet on a waveguide, which can be made highly reflecting by adding dielectric or metal coatings. Possible configurations for this type of reflector are shown in FIGS. 14A, B, although some embodiments use more direct coupling, for example butt-coupling, to optically couple the gain chip 100 and the filter chip 200. In the configurations of FIGS. 14A, B, waveguides terminating or bounded by reflectors, or mirrors, are used as resonators. In FIG. 14A, waveguides 1400 and 1410 are brought to edges of the device, where mirrors are formed by polishing and applying optical coatings 1420, 1430, and 1440. A variation of this example would be to bend at least one of the waveguides more, such that an end of the waveguide terminates on an edge which also terminates another end of the waveguide or an end of another waveguide so that fewer edges of the device are polished and coated. In FIG. 14B, mirrors 1450, 1460, 1470, and 1480 are formed inside a perimeter of the chip by means of deep etching through the waveguides 1490 and 1495, and preferably entirely through the waveguides to form facets. The facets can again be coated with dielectric or metal in order to enhance reflectivity. An advantage of the etched mirrors is that the length of the cavity is precisely controlled by lithography so the free spectral range of each reflector can be tightly controlled.

In general, there are a variety of resonator structures that can be realized in silicon. Using a microlens to couple an optically active semiconductor gain chip to the silicon filter can result in a simple low cost tunable laser, where tuning can be obtained by adjusting the resonator structures on the silicon filter.

In the foregoing specifications, the invention has been described with reference to specific exemplary embodiments thereof. It will, however, be evident that various modifications and changes may be made thereto without departing from the broader spirit and scope of the invention as forth in the appended claims. For example other resonator structures may be used to provide feedback, or the silicon filter wafer may be mounted on its side to eliminate the need for a prism. The specifications and drawings are, accordingly, to be regarded in an illustrative sense rather than a restrictive sense.

What is claimed is:

1. An external cavity laser device, temperature controlled to produce a predominantly single output wavelength, comprising:
    a semiconductor waveguide chip electrically activated to provide optical gain;
    a second waveguide based device, of a different material and technology than the semiconductor waveguide chip, positioned to receive light of the semiconductor waveguide chip and provides a wavelength-selective optical feedback;

an optical element to collect and refocus light from the semiconductor waveguide chip into the second waveguide based device and refocus the optical feedback from the second waveguide based device into the semiconductor waveguide chip; and further comprising at least one micromechanical arm coupled to the optical element, the micromechanical arm including a handle positioned away from the optical element such that movement of the handle results in movement of the lens that is reduced compared to movement of the handle.

2. The device of claim 1, further comprising means for fixing position of the micromechanical arm.

3. The device of claim 2, wherein at least a portion of the micromechanical arm is moveable absent application of the means for fixing position of the micromechanical arm.

4. The device of claim 1, wherein the second waveguide-based device includes ring resonator filters fabricated in silicon.

5. The device of claim 4 wherein at least one of the ring resonator filters are tuned to vary the optical feedback to the semiconductor waveguide chip.

* * * * *